United States Patent
Zhou et al.

[11] Patent Number: 5,858,847
[45] Date of Patent: Jan. 12, 1999

[54] METHOD FOR A LIGHTLY DOPED DRAIN STRUCTURE

[75] Inventors: Mei Sheng Zhou; Yelehanka Ramachandramurthy Pradeep; Dajiang Xu, all of Singapore, Singapore

[73] Assignee: Chartered Semiconductor Manufacturing, Ltd., Singapore, Singapore

[21] Appl. No.: 827,239

[22] Filed: Mar. 28, 1997

[51] Int. Cl.⁶ ................................. H01L 21/47
[52] U.S. Cl. .................... 438/305; 438/232; 438/299; 438/303; 438/695; 438/696; 438/780
[58] Field of Search ............... 438/232, 305, 438/694, 695, 696, 780, 787, 299, 303

[56] References Cited

U.S. PATENT DOCUMENTS

| | | | |
|---|---|---|---|
| 4,994,404 | 2/1991 | Sheng et al. | 438/297 |
| 5,286,664 | 2/1994 | Horiuchi | 437/44 |
| 5,320,974 | 6/1994 | Hori et al. | 437/44 |
| 5,518,940 | 5/1996 | Hodate et al. | 437/41 |
| 5,674,782 | 10/1997 | Lee et al. | 438/592 |
| 5,801,077 | 7/1998 | Chor et al. | 438/305 |

*Primary Examiner*—John F. Niebling
*Assistant Examiner*—John Murphy
*Attorney, Agent, or Firm*—George O. Saile; Stephen B. Ackerman; William J. Stoffel

[57] ABSTRACT

The present invention provides a method of manufacturing a lightly doped drain (LDD) structure using a polymer layer to define the LDD. The polymer layer is formed in an etch step which defines the gate electrode. The method begins by forming spaced field oxide regions 12 in a substrate 10. Next, a gate oxide layer 14, and a material layer 18 and a hard mask layer 22 are sequentially formed over the active area and the field oxide regions 12. A photo resist block 24 is formed over the hard mask layer 22 over the active area. The hard mask layer 22 is etched using the photo resist block 24 as a mask forming a hard mask block 22. The etch simultaneously forms a polymer layer 26 over the a top and sidewalls of the photo resist block 24 and over the sidewalls of the hard mask block. Impurities ions are implanted into the substrate in the active area using the polymer layer 26 as a mask forming highly doped drain regions 30 in the substrate 10. Next, the photo resist block 24 and the polymer layer 26 are removed. The hard mask is used as an etch barrier to etch the gate material to form a gate electrode 19 between the lightly doped drains. Subsequently, impurities ions are implanted into the substrate in the active area using the hard mask block 23 as a mask forming lightly doped drain regions 34 in the substrate 10.

13 Claims, 4 Drawing Sheets

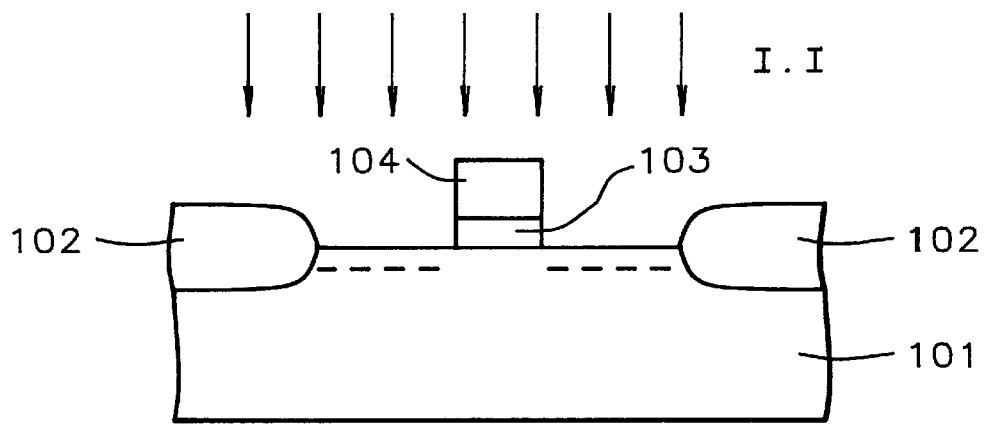
FIG. 6A - Prior Art
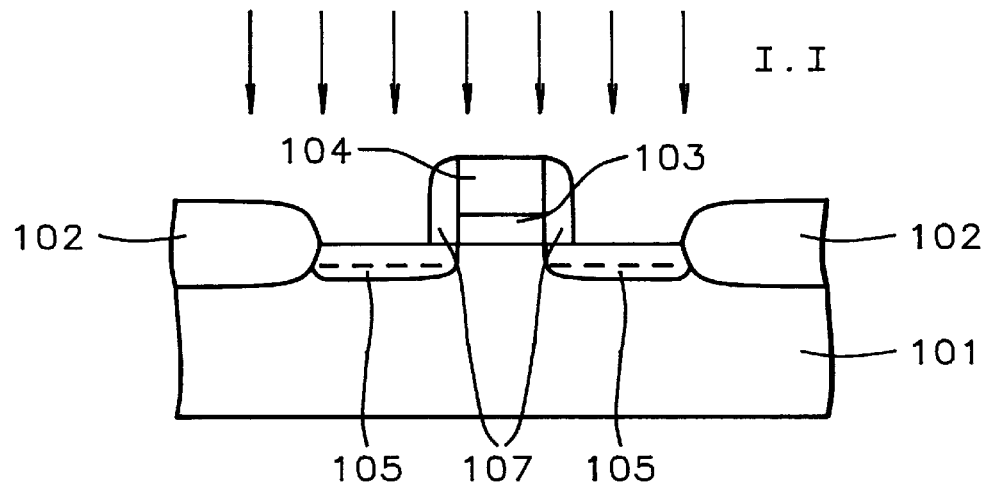
FIG. 6B - Prior Art
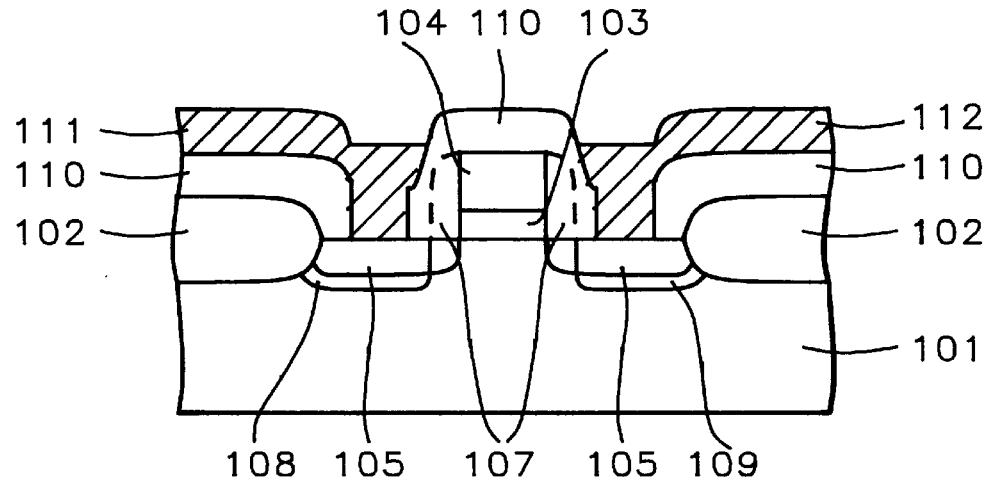
FIG. 6C - Prior Art

METHOD FOR A LIGHTLY DOPED DRAIN STRUCTURE

BACKGROUND OF THE INVENTION

1) Field of the Invention

This invention relates generally the fabrication of doped regions in a semiconductor device and more particularly to a method of forming a lightly doped drain (LDD) structure for a semiconductor device.

2) Description of the Prior Art

Extensive research and development is being conducted to micronization semiconductor elements. In particular, the micro-miniaturization of an insulated gate effect transistor called a metal oxide semiconductor FET (MOSFET) is remarkable. The miniaturization of a MOSFET is achieved by shortening a width of a gate electrode in channel length direction. The shorter gate electrode naturally shortens the length of a channel region thereunder. The short channel improves transistor performance. The length of time required for carriers to pass through the channel portion is reduced, thus resulting in a higher speed along with greater integration. When the gate electrode is shortened, however, hot electrons are produced by a short channel effect, thus bringing about threshold voltage variation or lowering of channel conductance. Namely, in a conventional structure a channel region composed of a first conductive type impurity diffused layer of low concentration is put between a source region and a drain region composed of a second conductive type impurity diffused layer of high concentration, an electric field applied to the vicinity of a boundary among a source region, a drain region and a channel region is increased in a state that voltage is applied between the source region and the drain region as the channel region is narrowed. As a result, the operation of the MOSFET becomes very unstable.

A new structure of a MOSFET has been developed for the purpose of controlling such a short channel effect. The LDD has a layer structure of a high impurity concentration and a shallow low impurity concentration region formed in a source region and a drain region, and the low concentration region of these regions stretches out a little towards the gate electrode. It has become possible to reduce the electric field produced in the vicinity of the boundary among the source region, the drain region, and the channel region, thereby to stabilize the operation of the element by the LDD.

An example of a method of manufacturing a conventional LDD insulated gate field effect transistor will be shown in FIGS. 6A to 6C. First, as shown in FIG. 6A, a gate electrode 104 is formed over a gate oxide film 103 on a surface of a p-type semiconductor substrate 101 surrounded by a field insulating film 102. The gate oxide film 103 and the gate electrode 104 are formed through a film forming process and a photolithography process.

Then, n-type impurity diffused regions 105 and 106 having comparatively low impurity concentration are formed in a self-aligned matter by ion implantation using the gate electrode 104 and the field insulating film 102 as a mask.

Then, after an insulating film such as PSG and silicon oxide are formed by chemical vapor deposition (CVD) on the whole body so as to cover the gate electrode 104 and the n-type impurity diffused regions 105 and 106, the insulating film is etched anisotropically in a perpendicular direction and made to remain locally on the side of the gate electrode 104 as shown in FIG. 6B.

The remaining insulating film is called a spacer or a sidewall in general. N+ type impurity diffused regions 108 and 109 having high impurity concentration such as those shown in FIG. 6C are formed in a self-aligning manner by ion implantation for a second time using the gate electrode 104 and a side wall 107 as the mask.

Then an interlayer insulating film 110 is formed on the whole body, and contact holes are formed therethrough, thereby to connect a source electrode 111 and a drain electrode 112 to the N+ type impurity diffused regions 108 and 109. With this, an insulated gate fields effect transistor having a LDD structure is formed in an element forming region. A process of manufacturing an n-type MOS has been described above but a p-type MOS is also formed through an almost similar process.

According to the process described above, however, the side wall 107 on the side of the gate electrode 104 vary in width. This varying width is caused by the anisotropic etching. The irradiation angle of ions used for etching becomes uneven and the width of the sidewall 107 varies when the substrate becomes large in size.

In a conventional LDD, it has been impossible to increase the aspect ratio without restriction because of the inherit limitation in the sidewall spacer process. The width of the sidewall 107 formed by the anisotropic etching depends on the height of the gate electrode 104. Normally, the width of the sidewall (e.g., spacers) 107 reaches 20% or more of the height of the gate electrode 104. When the width of the sidewall 107 becomes wider, the n-type impurity diffuse (low concentration) regions (redefined smaller regions -see FIG. 6c) 105 and 106 become wider and the resistance between a source and a drain is increased, thus deteriorating transistor characteristics.

Practitioners in the art have attempted to improve the LDD structure. For example, U.S. Pat. No. 5,518,940 (Hodate et al.) teaches a method of forming LDD regions adjacent to a gate using a photoresist layer as a spacer. The photoresist layer is composed of an electrolyte containing resist. The charged gate is soaked in the electrolyte containing resist to form the photoresist spacer on the gate. However, this process is complicated, expensive and hard to control in manufacturing.

Also, U.S. Pat. No. 5,320,974 (Hori et al.) teaches a method of implanting impurities around a gate after an oxide spacer is removed. U.S. Pat. No. 5,286,664 (Horiuchi) shows a process of fabricating an asymmetrical LDD-MOSFET of the type in which a diffused low-doped layer is provided only on the drain side. In a MOSFET-formed region, after forming a gate electrode, using a photoresist film covering one sidewall of the gate electrode and the vicinity thereof, ion implantation is performed to form a diffused lightly-doped layer.

However, there is still a need for an improved LDD process that eliminates the problems associated with the convention al spacer and spacer etch processes.

SUMMARY OF THE INVENTION

It is an object of the present invention to provide a method for fabricating a lightly doped drain (LDD) structure that has less steps to manufacture, is simpler and more controllable in manufacturing.

It is an object of the present invention to provide a method for fabricating a lightly doped drain (LDD) structure that uses a hard mask and produces a sub-micron gate.

It is an object of the present invention to provide a method for fabricating a lightly doped drain (LDD) structure using a hard mask and using a controlled polymer deposition process on photo resist block.

To accomplish the above objectives, the present invention provides a method of manufacturing a lightly doped drain (LDD) structure in a substrate. The method begins by forming spaced field oxide regions 12 in a substrate 10. The spaced field oxide regions 12 define active areas on the substrate. Next, a gate oxide layer 14, a gate material layer 18, and a hard mask layer 22 are sequentially formed over the active area and the field oxide regions 12. A photo resist block 24 is formed over the hard mask layer 22 over the active area. The hard mask layer 22 is etched using the photo resist block 24 as a mask forming a hard mask block 23. The etch simultaneously forms a polymer layer 26 over the top and sidewalls of the photo resist block 24 and over the sidewalls of the hard mask block 23. Impurity ions are implanted into the substrate in the active area using the polymer layer 26 as a mask forming highly doped drain regions 30 in the substrate 10. Next, the photo resist block 24 and the polymer layer 26 are removed. The hard mask is used as an etch barrier to etch the gate material to form a gate electrode 19 between the lightly doped drains. Subsequently, impurities ions are implanted into the substrate in the active area using the hard mask block 23 as a mask forming lightly doped drain regions 34 in the substrate 10.

The method of the current invention is a highly manufacturable method for forming submicron gates. The method is a simpler method of forming the lightly doped drain structure that eliminates the process steps of spacer oxide deposition and spacer etch. The width of the polymer layer and the lightly doped drain is highly controllable and can be formed thinner than traditional dielectric and photoresist spacers.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 6A–6C are a cross sectional views for illustrating a method for manufacturing a lightly doped drain structure according to the prior art.

DETAILED DESCRIPTION OF THE PREFERRED EMBODIMENTS

The present invention will be described in detail with reference to the accompanying drawings. The present invention provides a method of forming a LDD structure which has small dimension and is simple to manufacture. It should be well understood by one skilled in the art that, by including additional process steps not described in this embodiment, other types of devices can also be included on the chip. For example, P wells in the P substrate and CMOS circuit can be formed therefrom. It should also be understood that the figures depict only one LDD structure and FET out of a multitude of cells that are fabricated simultaneously on the substrate.

Figure 1:
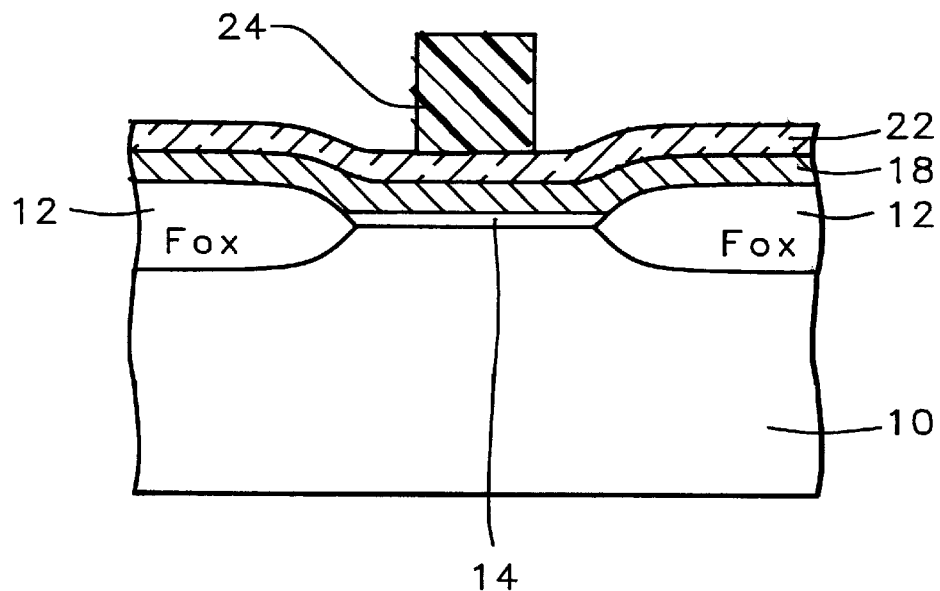
FIGS. 1 through 5 are cross sectional views for illustrating a method for manufacturing a lightly doped drain structure according to the present invention.

As shown in FIG. 1, spaced field oxide regions 12 are formed in a substrate 10. The spaced field oxide regions 12 define active areas on the substrate. The substrate 10 is preferably a silicon semiconductor substrate having a p-background doping and a (100) crystal orientation. The substrate 10 is understood to possibly include a semiconductor wafer, active and passive devices formed within the wafer and layers formed on the wafer surface.

One method of forming these field oxide regions 12 is described by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions called active areas. The field oxide regions 12 preferably have a thickness in a range of between about 2000 and 8000 Å.

Still referring to FIG. 1, a gate oxide layer 14, a gate material layer 18 and a hard mask layer 22 are sequentially formed over the active area and the field oxide regions 12.

The gate oxide layer 14 can be formed by a conventional thermal oxidation process. The gate oxide layer 14 preferably has thickness in a range of between about 20 and 150 Å.

Next, the gate material layer 18 is formed over the gate oxide layer. Later the gate material layer will be patterned to form the gate electrode of the transistor. The gate material layer 18 can be composed of a polycide or polysilicon and is preferably formed of polysilicon. The polysilicon layer can be doped with n-type pr p-type impurities as desired. The polysilicon layer is preferably doped with n-type impurities, such as phosphorus or with p-type impurities such as boron. The impurity concentration is preferably in a range of between about 1E15 and 1E22 atoms/cm$^3$. The gate material layer preferably has a thickness in a range of between about 1500 and 3000 Å.

Next, a hard mask layer 22 is formed over the gate material layer 18. The hard mask layer 22 will function as an ion implant mask later on. The hard mask layer can be composed of silicon oxide, silicon nitride or silicon oxynitride and is more preferably composed of silicon oxide. The hard mask layer formed of silicon oxide is preferably formed using a Tetraethylorthosilicate (TEOS) process.

As show in FIG. 1, a photo resist block 24 is formed over the hard mask layer 22 over the active area. The photo resist block 24 is formed using conventional coat, expose, develop and etch lithography techniques. The photo resist block 24 has a top and sidewalls. The photo resist block 24 preferably has a width in a range of between about 0.18 and 1.25 μm. The photoresist (PR) is preferably composed of a organic photoresist.

Figure 2:
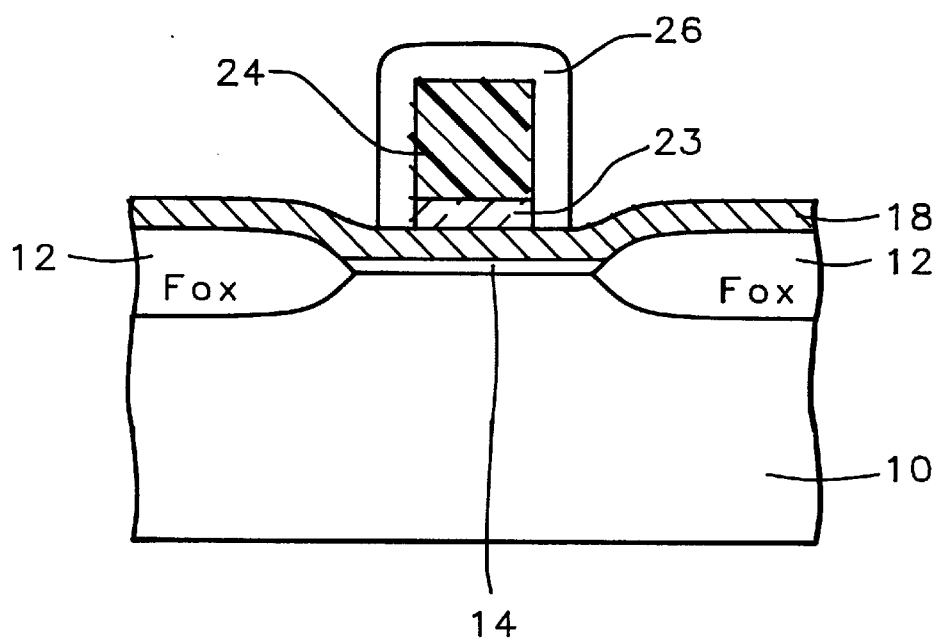

As shown in FIG. 2, in an important step, the hard mask layer 22 is etched using the photo resist block 24 as a mask forming a hard mask block 23. At the same time during the etch, a polymer layer 26 is formed over the top and sidewalls of the photo resist block 24 and over the sidewalls of the hard mask block 23.

The etch and formation of the polymer layer 26 are performed using a RIE etch by carefully controlling the etch parameters to properly form the polymer. The etching preferably comprises the preferred parameters show below in table 1:

TABLE 1

| | | Preferred Etch parameters | | |
|---|---|---|---|---|
| Variable | units | low limit | target | hi limit |
| Pressure | millitorr | 20 | 250 | 400 |
| preferred etch gasses- $CHF_3/CF_4$ | sccm | | | |
| Ratio of etch gasses | | 0.5:1 | 1:1 | 5:1 |
| Carrier Gasses - Argon | | | | |
| Etch Time - by end point detection | seconds | | | |
| over etch | % | 50% | 100% | 150% |
| RF Power | watt | 600W | 1300W | 1500W |

Both the etch of the hard mask and the polymer deposition (from the photoresist) occur simultaneously during the etch process.

The polymer layer 24 is composed of carbon, silicon, oxygen and hydrogen and preferably has a thickness in a range of between about 300 and 1500 Å and more preferably between about 500 and 1200 Å.

The etch gas ratio (e g., $CHF_3:CF_4$) variables are used to control the etching of the hard mask and the deposition of polymer over the photoresist. The polymer thickness can be adjusted by changing the etch gas ratio.

Figure 3:
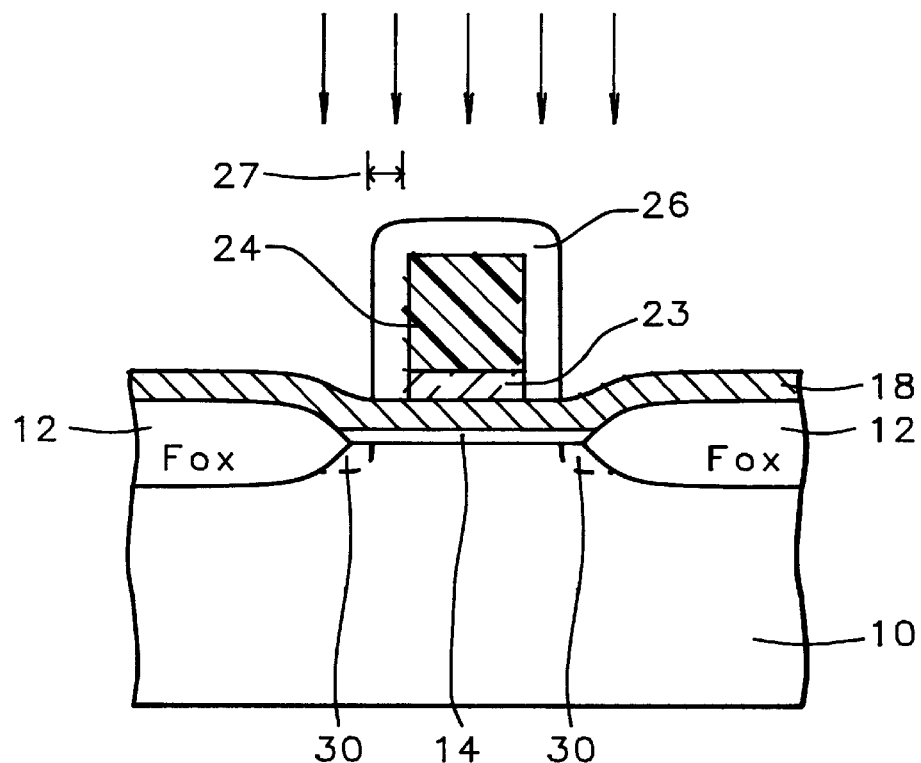

As shown in FIG. 3, impurities ions are implanted into the substrate in the active areas using the polymer layer 26 as a mask forming highly doped drain regions 30 in the substrate 10.

The implant is preferably a n-type implant using arsenic ions at an energy in a range of between about 100 and 250 Kev and a dose in a range of between about 1E15 and 5E16 atoms/$cm^2$. The highly doped drain regions 30 preferably have an impurity concentration in a range of between about 1E21 and 1E22 atoms/$cm^3$ and a depth below the substrate surface in a range of between about 0.1 and 0.5 μm. The ion implant (I/I) is performed through the gate material 18 which yields the following advantages: 1) reduces damage to the silicon, 2) eliminates channeling effect and 3) can eliminate poly-oxidation steps.

Figure 4:
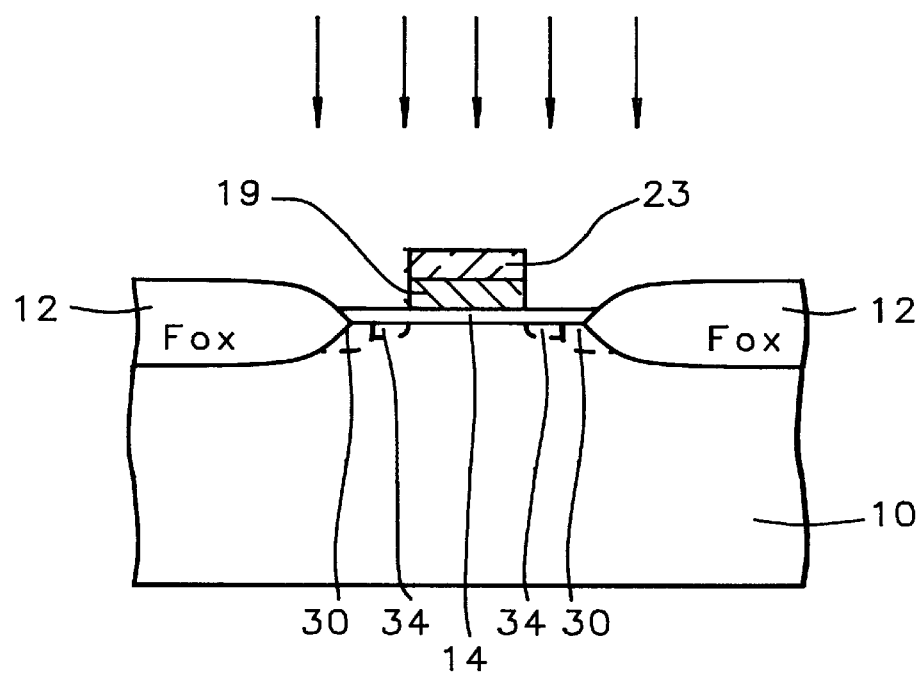

As shown in FIG. 4, the photo resist block 24 and the polymer layer 26 are now removed. The photoresist can be removed by conventional techniques. The polymer layer 26 can be removed by a wet etch such as a 100:1 $HF:H_2O$ (mixture) dip etch, a $NH4:H_2O_2$ or a RCA clean.

Still referring to FIG. 4, the hard mask 23 is used as an etch mask (etch barrier) to etch the gate material layer 18 to define the gate electrode 19. The gate electrode etch is preferably performed with $Cl_2/HBr/O_2$ reactive ion etch or high density plasma.

As shown in FIG. 4, impurity ions are implanted into the substrate in the active area using the hard mask block 23 as an I/I mask forming lightly doped drain regions 34 in the substrate 10. The hard mask 23 is an implant barrier preventing the ions from penetrating into the gate 19.

The light doped drain ion implant is preferably performed with Phosphorous (or Boron) impurities at an energy in a range of between about 25 and 100 keV and a dose in a range of between about 1E12 and 5E13. The light doped drains preferably have an impurity concentration in a range of between about 1E15 and 1E20 atoms/$cm^3$ and a depth below the substrate surface in a range of between about 0.1 and 0.5 μm and preferably have a width in a range of between about 500 and 1500 Å. The width of the invention's lightly doped drain (LDD) is smaller than the possible widths of a conventional dielectric or Photoresist spacer. This is because the inventions process can control the thickness of the polymer layer 26 better than the conventional process can control the thicknesses of their spacers. Therefore the polymer deposition process of the instant invention provides better control of the LDD width and smaller LDD than conventional processes.

Processing continues in the formation of the field effect transistor (FET). The hard mask block 23 can be left on the gate or it can optionally be removed. The hard mask block is thermally stable and can remain in place.

Figure 5:
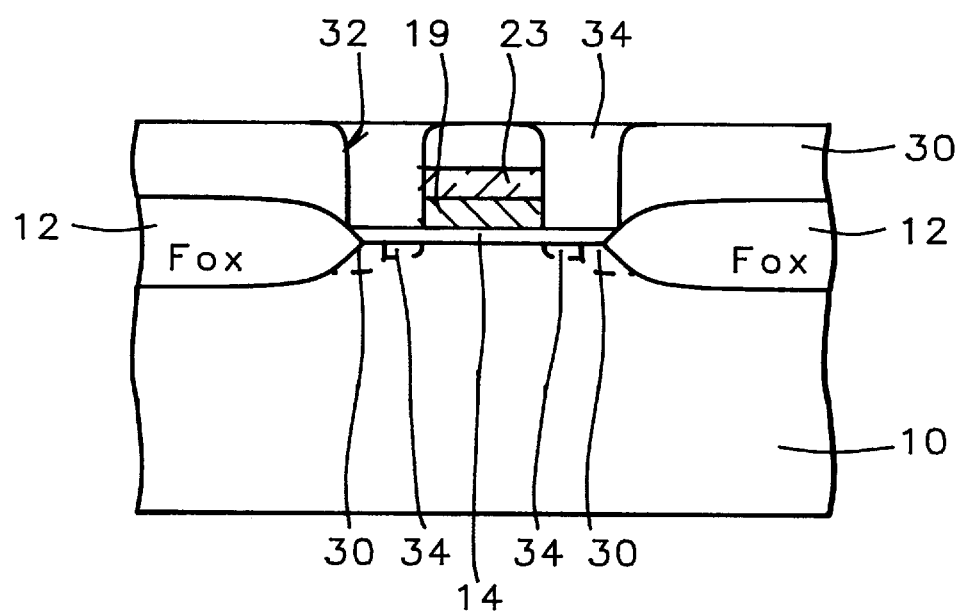

Next, as shown in FIG. 5, the transistor is completed by forming an insulating layer 30 over the resulting surface. The insulating layer 30 is preferably an oxide, such as a doped oxide like BPSG. The insulating layer preferably has a thickness in a range of between about 3000 and 10,000 Å. Contacts openings 32 are formed in the insulating layer 30. Conductive contacts 34 are made to said source and drain regions 30 34 and said gate electrode 19 (not shown).

The method of the current invention is a highly manufacturable process for forming submicron gates. The invention is a simpler method of forming the lightly doped drain structure that eliminates the steps of spacer oxide deposition and spacer etch. The invention is easily adaptable to existing processes, especially processes where the hard mask gate etch is a regular step forming the submicron gate electrode. The invention will have greater value in the future when width requirements of spacer and LDD become smaller.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a lightly doped drain (LDD) structure on a substrate comprising the steps of:

a) forming spaced field oxide regions in a substrate, said spaced field oxide regions defining active areas on said substrate;

b) sequentially forming a gate oxide layer, and a gate material layer and a hard mask layer over said active area and said field oxide regions;

c) forming a photo resist block over said hard mask layer over said active area; said photo resist block having a top and sidewalls;

d) etching said hard mask layer, using said photo resist block as a mask, forming a hard mask block and forming a polymer layer over said a top and sidewalls of said photo resist block and over the sidewalls of said hard mask block;

e) implanting impurities ions into said substrate in said active area using said polymer layer as a mask forming highly doped drain regions in said substrate;

f) removing the photo resist block and said polymer layer;

g) etching said gate material layer using said hard mask block as an etch mask forming a gate electrode over said active area;

h) implanting impurities ions into said substrate in said active area using said hard mask block as a mask forming lightly doped drain regions in said substrate;

i) forming an insulating layer over the resulting surface and forming contacts to said source and drain regions and said gate electrode thereby completing said LDD structure.

2. The method of claim 1 which further includes forming an insulating layer over the resulting surface and forming contacts to said source and drain regions and said gate electrode thereby completing said lightly doped drain structure.

3. The method of claim 1 wherein said field oxide regions having a thickness in a range of between about 2000 and 8000 Å.

4. The method of claim 1 wherein said gate oxide layer has thickness in a range of between about 20 and 150 Å.

5. The method of claim 1 wherein said gate material layer composed of a material selected from the group consisting of a polycide and polysilicon; and has a thickness in a range of between about 1500 and 3000 Å.

6. The method of claim 1 wherein said photo resist block having a width in a range of between about 0.18 and 1.25 µm.

7. The method of claim 1 wherein the etching of said hard mask layer comprises an etch using $CHF_3/CF_4$ etch gasses, at a pressure between about 20 and 400 mtorr, Ratio of etch gasses between about 0.5:1 and 5:1; using an Ar carrier gas, with an overetch between about 50% and 150%, and at a RF Power between about 600 W and 1500 W.

8. The method of claim I wherein said polymer layer is composed of carbon, silicon, oxygen and hydrogen and has a thickness in a range of between about 500 and 1200 Å.

9. A method of fabrication of a lightly doped drain (LDD) structure in a substrate using a polymer layer to define the lightly doped drain comprising the steps of:

a) forming spaced field oxide regions in a substrate, said spaced field oxide regions defining active areas on said substrate;

b) sequentially forming a gate oxide layer, and a gate material layer and a hard mask layer over said active area and said field oxide regions;

c) forming a photo resist block over said hard mask layer over portions of said active area; said photo resist block having a top and sidewalls; said photo resist block having a width in a range of between about 0.18 and 1.25 µm;

d) etching said hard mask layer using said photo resist block as a mask forming a hard mask block and simultaneously deposition a polymer layer over said a top and sidewalls of said photo resist block and over the sidewalls of said hard mask block; said polymer layer comprises carbon, silicon, oxygen and hydrogen and said polymer layer has a thickness in a range of between about 500 and 1200 Å;

e) implanting impurities ions into said substrate in said active area using said polymer layer as a mask forming highly doped drain regions in said substrate;

f) removing the photo resist block and said polymer layer;

g) etching said gate material layer using said hard mask block as an etch mask forming a gate electrode over said active area;

h) implanting impurity ions into said substrate in said active area using said hard mask block as a mask forming lightly doped drain regions in said substrate;

i) forming an insulating layer over the resulting surface and forming contacts to said source and drain regions and said gate electrode thereby completing said LDD structure.

10. The method of claim 9 wherein said field oxide regions having a thickness in a range of between about 2000 and 8000 Å.

11. The method of claim 9 wherein said gate oxide layer has thickness in a range of between about 20 and 150 Å.

12. The method of claim 9 wherein said gate material layer composed of a material selected from the group consisting of a polycide and polysilicon and has a thickness in a range of between about 1500 and 3000 Å.

13. The method of claim 9 wherein the etching of said hard mask layer comprises an etch using $CHF_3/CF_4$ etch gasses, at a pressure between about 20 and 400 mtorr, with a ratio between said etch gasses between about 0.5:1 and 5:1; using an Ar carrier gas, with an overetch between about 50% and 150%, and at a RF Power between about 600 W and 1500 W.

* * * * *